United States Patent [19]
Futsuhara

[11] Patent Number: 4,757,417
[45] Date of Patent: Jul. 12, 1988

[54] MONITORING SYSTEM FOR LOAD-DRIVING SWITCH CIRCUITS

[75] Inventor: Koichi Futsuhara, Omiya, Japan

[73] Assignee: The Nippon Signal Co., Ltd., Japan

[21] Appl. No.: 723,921

[22] Filed: Apr. 16, 1985

[30] Foreign Application Priority Data

Apr. 19, 1984 [JP] Japan .................. 59-79286

[51] Int. Cl.⁴ .............................................. H02B 3/28
[52] U.S. Cl. ........................................ 361/86; 361/78; 361/88; 361/91
[58] Field of Search ............................. 361/42, 54–58, 361/78, 86, 88, 90, 91, 101, 187; 340/649–651, 662, 663; 323/276–279; 307/252 B

[56] References Cited

U.S. PATENT DOCUMENTS

| | | | |
|---|---|---|---|
| 3,557,381 | 1/1971 | Henry | 307/252 B X |
| 3,992,636 | 11/1976 | Kiffmeyer | 361/88 X |
| 4,320,434 | 3/1982 | Stirk | 361/86 |
| 4,363,068 | 12/1982 | Burns | 361/91 |

FOREIGN PATENT DOCUMENTS 57-4764 11/1982 Japan .

Primary Examiner—A. D. Pellinen
Assistant Examiner—Todd E. DeBoer
Attorney, Agent, or Firm—Lowe, Price, Leblanc, Becker & Shur

[57] ABSTRACT

Disclosed is a monitoring system for a load-driving switch circuit, in which a switch circuit arranged in a circuit for driving an electrical load is controlled and opened or closed by a fail-safe input signal Si, the conduction state or non-conduction state of the switch circuit is detected by taking out a high voltage or low voltage from terminals of the switch circuit, and logical addition of this terminal voltage and the input signal Si is performed to detect whether or not the terminal voltage is in agreement with the input signal Si, whereby malfunction of the load owing to trouble in the switch circuit is monitored.

20 Claims, 5 Drawing Sheets

MONITORING SYSTEM FOR LOAD-DRIVING SWITCH CIRCUITS

FIELD OF THE INVENTION

The present invention relates to a monitoring system which are highly fail-safe for load-driving switch circuits which are used for driving loads in railways, traffic facilities, press machines and various plants. More specifically, the present invention relates to a monitoring system having an excellent by characteristic fail-safe effect, in which a switch circuit for driving a load can be directly controlled by an input signal.

BACKGROUND OF THE INVENTION

In controlling cars on railways or press machine where a high fail-safe characteristic is required, it is indispensible to use an apparatus or equipment having such a fail-safe property that when a circuit problem such as a short circuit, breaking or the like takes place the circuit is switched over to the safe side without fail. Therefore, when a load which is to be controlled, for example a motor or a relay, is driven, the fail-safe characteristic is similarly required.

If a switch circuit for driving a load is directly controlled by an input signal in view of this fail-safe property, trouble in the switch circuit results in malfunction of the load. Therefore, according to the conventional technique, the load cannot be directly controlled by an input signal, and a signal-receiving system has to be interposed between the input signal and the load so as to maintain the fail-safe effect. For example, in a conventional well-known load-driving switch circuit, in order to ensure maintenance of the fail-safe effect, a direct current relay having a silver-carbon type contact, in which a fusion trouble seldom occurs, is used. A signal-receiving circuit comprising an amplifier, a transformer and a rectifying circuit is interposed between this direct current relay and an input terminal for a control signal to amplify an alternating current signal Si applied to the input terminal through the transformer, the amplified signal is supplied to the rectifying circuit to convert it to a direct current signal, and the direct current relay is excited by the converted direct current signal to drive the load indirectly through this contact.

Thus, in the conventional load-driving switch circuit, the fail-safe effect is attained by utilizing the transformer-connected amplifier (amplification by an alternating current operation) and the direct current relay. According to this method, however, it is impossible to control the load directly by an input signal. Furthermore, since a transistor constituting the signal-receiving transistor is used in an unsaturated region because of its function, the circuit efficiency is low, and moreover, the structure between the input signal and the load is complicated and the connection has to be effected through a contact.

Furthermore, it is known that a relay is used for a safety apparatus used in the field of pressing machines. This safety apparatus is constructed so that when a hand of an operator is placed on a bolster plate, a slide is inhibited from falling down, and the relay is used for detecting an output of a sensor of the safety apparatus (the sensor detects the presence of the operator's hand on the bolster plate or in the vicinity thereof). This output relay is directly driven by a collector of a transistor without passage through a transformer. However, in order to make it always possible to inspect whether or not the relay is turned on even in the absence of an instruction of turning on the contact output because of trouble in the driving transistor or fusion trouble of the contact, inspection is ordinarily performed by using, for example, a switch for reducing the relay-driving input to zero.

However, this inspection becomes insignificant if a trouble takes place during the inspection, and in order to ensure safety, the inspection should always be performed by an operator.

SUMMARY OF THE INVENTION

It is a primary object of the present invention to provide a load-driving circuit in which a load is directly driven without passage through a relay and wherein trouble can be detected even if inspection is not frequently performed.

According to the load-driving switch circuit of the present invention, an input signal is applied to attain a fail-safe effect, the conduction state or non-conduction state of a switching circuit turning on or off a driving circuit for an electrical load is detected by a switching detecting circuit, and occurrence of trouble in the switch circuit is monitored by ascertaining whether or not the detection signal is in agreement with the input signal.

Furthermore, according to the load-driving switch circuit of the present invention, the voltage between terminals of the switch circuit is detected by fail-safe switching detecting means which generates a low voltage output when the switch circuit is in the conduction state and generates a high voltage output when the switch circuit is in the non-conduction state, and the output of the switching detecting means and the above-mentioned input signal Si are subjected to logical addition by logical addition circuit and occurrence of trouble in the switch circuit is monitored by an output signal generated by the logical addition circuit.

The switching element for the switch circuit of the present invention is a semiconductor output switching element such as a transistor or a thyristor. Moreover, a composite element such as a photo-coupling thyristor may be used.

Moreover, according to the load-driving switch circuit of the present invention, fail-safe photo-coupling means is used as the above-mentioned switching detecting means.

Still in addition, according to the load-driving switch circuit of the present invention, there are provided a switch circuit and switching detecting means suitably applied when a load is driven by an alternating current power source.

The load-driving switch circuit of the present invention is provided with monitor signal-generating means for using a preset signal for monitoring and putting out, in a fail-safe manner, an output of a high or low voltage which is generated when it is determined whether or not the detection signal of the above-mentioned switching detecting circuit is in agreement with the input signal.

In this case, according to the present invention, it is possible to use an oscillator such as a window comparator for monitoring the input signal to the monitor signal-generating means.

In the preset signal-generating means of the present invention, a signal taken out from the switching detecting circuit is utilized, and automatic presetting of the monitor signal-generating means can be performed by this signal.

By an output of the monitoring system of the present invention, switching of the load-driving circuit is controlled and fail-safe control of the load is made possible.

BRIEF DESCRIPTION OF THE DRAWINGS

FIG. 4a shows a variation of FIG. 4.

DETAILED DESCRIPTION OF THE PREFERRED EMBODIMENTS

Figure 1:
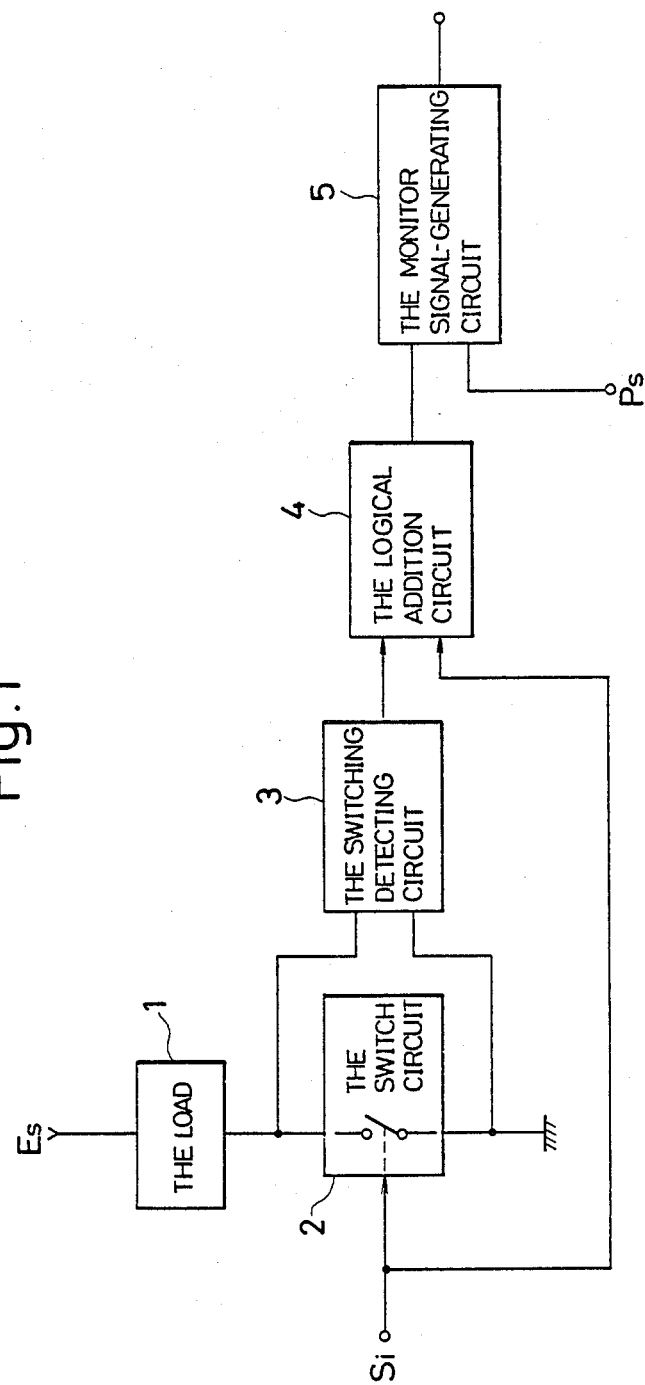
FIG. 1 is a block circuit diagram illustrating the basic structure of the monitoring system of the present invention.

FIG. 1 is a block diagram showing the basic structure of the present invention. A load 1 is driven when a switch circuit 2 connected to a driving circuit for the load 1 in series is placed in the ON state (conduction state) directly by the control directly by an input signal Si. A switching detecting circuit 3 detects the ON state (conduction state) or OFF state (non-conduction state) of the switch circuit 2 by detecting the voltage between terminals of the switching detecting circuit 3. The switching detecting circuit 3 generates a low voltage output when the switch circuit 2 is in the ON state and generates a high voltage output when the switch circuit 2 is in the OFF state. The switching detecting circuit 3 is constructed so as to attain a fail-safe effect. A logical addition circuit 4 is a fail-safe circuit for performing logical addition of the output of the switching detecting circuit 3 and the input signal Si for controlling the switch circuit 2 being input conditions.

A monitor signal-generating circuit 5 latches a high voltage output of the logical addition circuit 4 in response to a predetermined preset signal Ps and is kept in the high voltage output state and after latches, the circuit 5 detects reduction of the output voltage of the logical addition circuit 4 when the output voltage of the logical addition circuit 4 is lowered and releases the latched level to generate a low voltage output.

In the monitoring system having the above-mentioned structure, the ON or OFF state of the switch circuit turning on or off the power source of the load is detected. In the logical addition circuit 4 the logical addition of the ON or OFF state of the switch circuit and the presence or absence of the input signal Si is performed. The high voltage output of the logical addition circuit 4 is latched and put out by the monitor signal-generating circuit 5, and when the output of the logical addition circuit is reduced to zero, the latched value is released, whereby an accident of the load-driving switch circuit 4, such as breaking or short circuit, can be detected.

Accordingly, it is possible to immediately and assuredly detect a most dangerous accident, that is, supply of a power to the load 1 in the state where there is not present the input signal Si. If the supplied power source voltage Es is forcibly intercepted by this detection information, the fail-safe effect can be attained assuredly, with the result that there is exerted a very excellent effect of controlling the load by feeding the input signal directly to the switch circuit such as a semiconductor switching element.

Moreover, since the load can be directly controlled by the input signal, the structure between the input signal and the load is much simplified and the circuit efficiency is enhanced.

In the above-mentioned system, the monitor signal-generating circuit 5 is not absolutely indispensible. The output of the logical addition circuit 4 can be directly used as the monitor signal for the switch circuit. That is, the monitor signal-generating circuit 5 is disposed to monitor the output of the logical addition circuit 4 with a further enhanced fail-safe effect.

Figure 2:
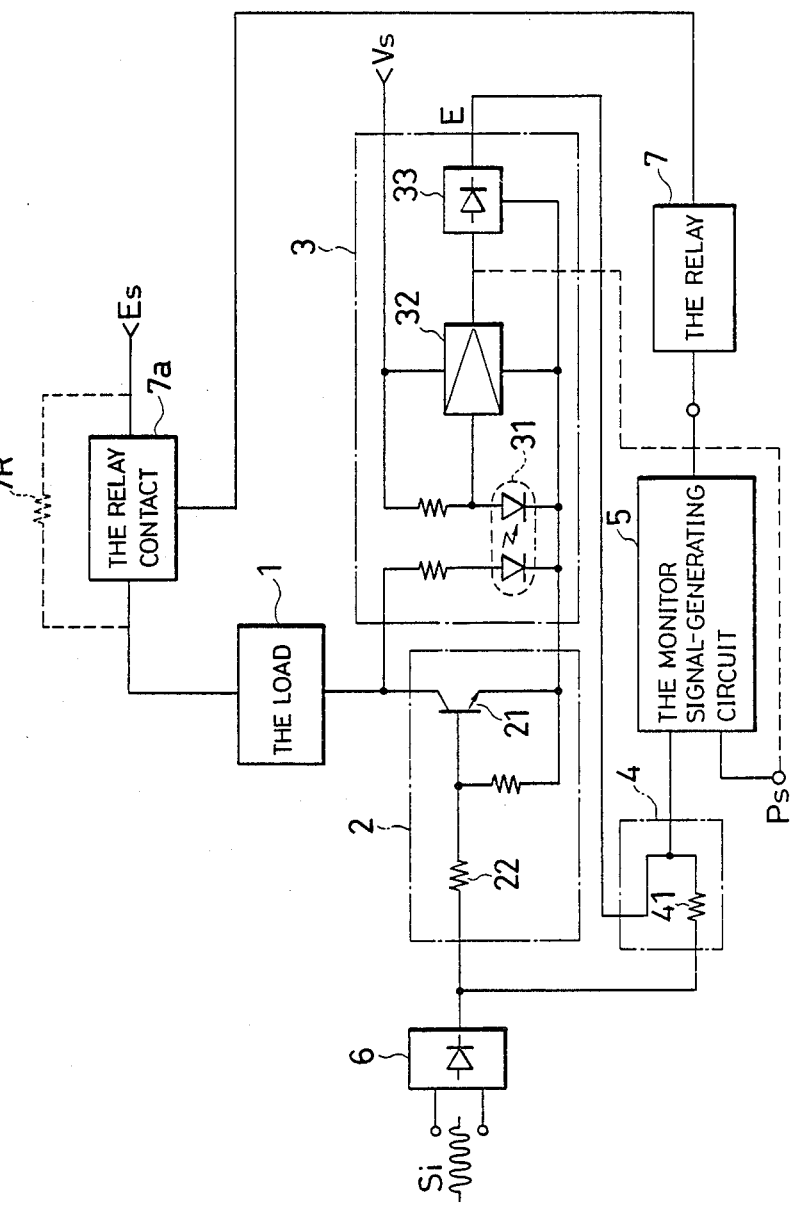
FIG. 2 is a circuit diagram illustrating a first embodiment of the present invention.

FIG. 2 illustrates a first embodiment of the monitoring system according to the present invention. In this embodiment, a load arranged in a direct current voltage driving circuit is monitored. Ripple voltage included in the direct current power source Es is utilized for detecting the ON state or OFF state of a transistor 21 constituting the switch circuit 2. The switching detecting circuit 3 comprises a photo-coupler 31 connected in parallel to the switch circuit 2, an alternating current amplifier 32 for amplifying the output voltage of the photo-coupler 31 and a rectifying circuit 33 for rectifying the output voltage from the amplifier 32. The logical addition circuit 4 is constructed by a wired OR circuit. The monitor signal-generating circuit 5 is constructed by a window comparator described hereinafter. The resistance value of a resistor 71 is sufficiently larger than that of a resistor 22 so that the transistor 21 cannot be turned on by the output E of the rectifying circuit 33. This condition can be easily realized if the input Si is maintained at a sufficiently high level. Incidentally, the input signal Si is ordinarily supplied as a fail-safe signal from the preceding circuit (the signal voltage is reduced to 0 volts when trouble occurs on the input side).

The input signal Si supplied as an alternating current is converted to a direct current signal in the rectifying circuit 6 and is given to a base terminal of the transistor 21 of the switch circuit 2. The transistor 21 is turned on (conduction state) by this input signal Si to apply the direct current power source voltage to the load 1 and drive the load 1. While the transistor 21 is kept in the ON state, the voltage between an emitter and a collector of the transistor is substantially zero. Accordingly, the photo-coupler 31 does not emit any light. Therefore, the output E of the rectifying circuit 33 is zero.

While the transistor 21 is kept in the OFF state (non-conduction state), the power source voltage is applied to the photo-coupler 31, and hence, a light-emitting element of the photo-coupler 31 emits a light and pulsates according to the ripple voltage included in the power source voltage, whereby an alternating current is given to a light-receiving element of the photo-coupler 31. This alternating current signal is amplified by the alternating current amplifier 32 and is converted to a direct current output by the rectifying circuit 33. Accordingly, when the transistor 21 is in the OFF state, the output E of the rectifying circuit 33 is maintained at a high voltage.

In connection with the relation between the input signal Si and the output E of the switching detecting circuit 3, it is considered that there are the following four cases.

(i) There is no output voltage E when there is no input signal Si.

(ii) There is an output voltage E when there is no input signal Si.

(iii) There is no output voltage E where there is an input signal Si.

(iv) There is an output E when there is an input signal Si.

Of the above-mentioned four cases (i) through (iv), it is only in the case (i) that a danger is caused to the load 1. That is, in the state where the power source voltage Es is applied to the load 1 even in spite of the absence of the input signal Si, the load 1 gets into danger. Incidentally, in the case (iv), the circuit does not perform the normal operation, but in this state, the power source voltage Es is not applied to the load 1 even in spite of the presence of the input signal Si, the load 1 is inhibited from operating and there is no danger. Accordingly, if only the state of the case (i) is detected, the fail-safe effect is attained in the circuit. The present invention detects this state of the case (i).

In each of the cases (ii), (iii) and (iv), an output is always generated from the rectifying circuit 6 or switching detecting circuit 3, and therefore, the output of the logical addition circuit 4 receiving the input from the circuit 6 or 3 is always "1" (high level). Accordingly, when this output of "1" from the logical addition circuit 4 is latched in the monitor signal-generating circuit 5 by the present signal Ps, the signal of "1" indicating the normal state of the switch circuit 2 is always put out from the monitor signal-generating circuit 5.

When the state of the case (i) is brought about during the above-mentioned self-retention indicating the normal state, the outputs from the rectifying circuit 6 and the switching detecting circuit 3 both disappear and the output of the logical addition circuit 4 is changed to "0", with the result that the latched condition of the monitor signal-generating circuit 5 is released and the output of the monitor signal-detecting circuit 5 is changed to "0". Thus, occurrence of trouble endangering the load 1 is immediately detected.

Accordingly, if an arrangement is made so that a monitor relay 7 is driven by the output of the monitor signal-generating circuit 5 and application of the power source voltage Es to the load is forcibly cut off by a contact 7a of the relay 7 or an alarm, which is provided as well as the relay 7 or in stead of the relay 7, is displayed, it becomes possible to drive the load 1 with a fail-safe effect. In the case where some sacrifice of the fail-safe property is allowed, for example, in the case where there is adopted a method in which the contact circuit 7a is cut off after an operator has found the presence of the output of the OR circuit 4, monitoring by the monitor signal-generating circuit 5 may be omitted.

In order to perform the operation with a fail-safe effect, it is necessary that a fail-safe circuit structure should be given to each of the switching detecting circuit 3, the logical addition circuit 4 and the monitor signal-generating circuit 5. In the embodiment shown in FIG. 2, the switching detecting circuit 3 performs fail-safe circuit operations because the circuit 3 is arranged so that the transducer (photo-coupler) and amplifier deal with the ripple component (as an alternating current signal) alone. Moreover, since a wired OR circuit (the output voltage is zero at the time of breaking) is used as the logical addition circuit 4, fail-safe operations are performed by the circuit 4.

Figure 3:
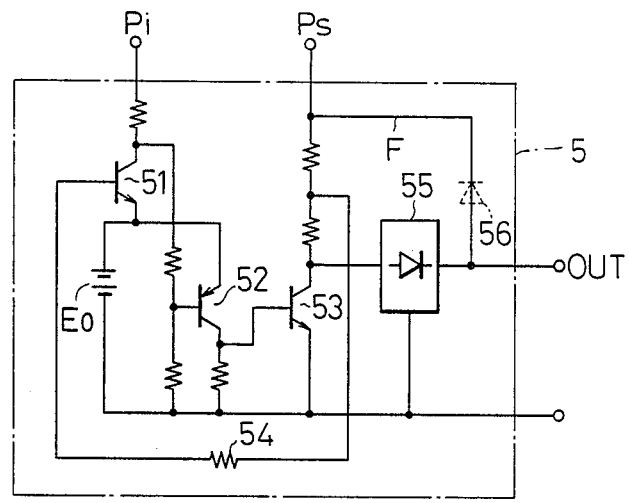
FIG. 3 is a circuit diagram illustrating an example of a monitor signal-generating circuit in the embodiment shown in FIG. 1.

A fail-safe structure for the monitor signal-generating circuit 5 may be constructed by arranging a window comparator proposed by us in Japanese Utility Model Application Laid-Open Specification No. 57-4764 as shown in FIG. 3. The circuit shown in FIG. 3 will now be described in brief. In the circuit shown in FIG. 3, a 2-input logical product computing oscillator is constructed by transistors 51, 52 and 53. When the preset signal Ps and the input from the logical addition circuit 4 simultaneously appear, oscillation is caused through a feedback resistor 54 because of delay characteristics of the transistors 52 and 53, and the output of this oscillation is rectified by a rectifier 55 and the rectified output is fed back toward the preset signal terminal through a feedback loop F to effect the self-retention. Because of the structure feature of the circuit shown in FIG. 3, oscillation is caused at an oscillation-initiating voltage a little higher than the power source voltage Eo in the circuit shown in FIG. 3, and if breaking is caused in any resistor or trouble such as short circuit or breaking is caused in any transistor, oscillation is stopped. Therefore, the circuit has very good fail-safe characteristics.

In the foregoing illustration of the first embodiment, the fail-safe operation for coping with trouble in the switch circuit 2 has been mainly described. However, since each of other circuits, such as the switching detecting circuit 3, the logical addition circuit 4 and the monitor signal-generating circuit 5, has a fail-safe property, it will readily be understood that fail-safe operations can be performed so as to cope with problems occurring in these circuits.

In the foregoing embodiment, the present signal Ps for effecting the latching in the monitor signal-generating circuit 5 is supplied externally. However, the latching can be automatically effected only when the transistor is not turned on (short-circuited), if there is adopted a modification where the output of the amplifier 32 for the ripple component is supplied to the monitor signal-generating circuit 5 as the present signal Ps therefore as indicated by a dotted line in FIG. 2, and a current having no substantial influence on the load 1 is caused to flow in the contact 7a of the monitoring relay 7 by adopting a resistor 7R having a high resistance value arranged in parallel to the relay contact 7R. The resistance value of the resistor 7a is also selected so as to be capable of generating an output of an alternating current signal of the ripple component in the output of the photo-coupler. The resistor 7R is also indicated by a dotted line. In this embodiment, if the monitor signal-generating circuit 5 is self-retained through a diode 56 as indicated by a dotted line in the feedback circuit F shown in FIG. 3, the preset signal is not transmitted to the output of the latching circuit.

In the structure shown in FIG. 2, the load current flows through the contact 7a of the monitoring relay 7. But since the transistor 21 is used in the load driving circuit and the contact 7a is usually closed, the contact 7a does not perform the ON-OFF operation. It is only when trouble occurs in the switch circuit 2 that the contact 7a operates to open. Although the transistors is used as the switch circuit 2 in the foregoing embodiment a composite element such as a thyristor or photo-coupling thyristor may be used with similar operation.

Incidentally, when a unilateral or bidirectional thyristor is used, the power source Es is an alternating current power source and it is apparent that a half-wave component of the power source voltage Es is generated in the output of the photo-coupler 31. It is seen that a transformer can be used instead of the photo-coupler.

Figure 4:
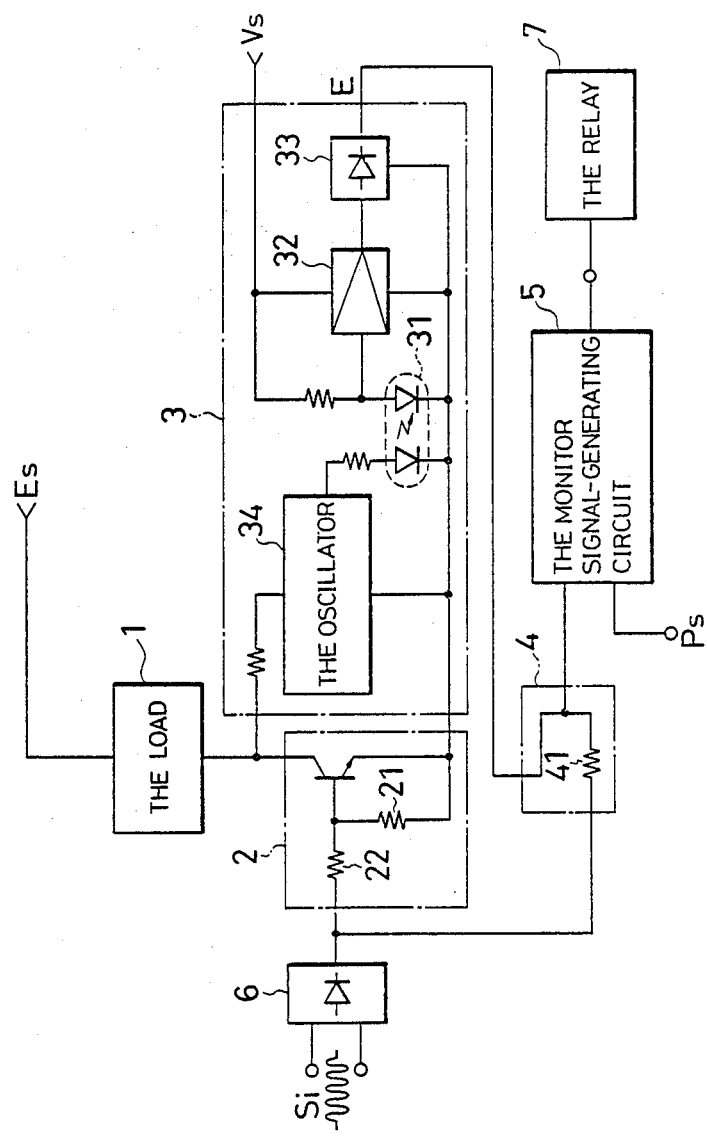
FIG. 4 is a circuit diagram illustrating a second embodiment of the present invention.

In FIG. 4 showing the second embodiment, there is illustrated an example of the structure of the switching detecting circuit 5 which is used when the direct current power source voltage Es has no substantial ripple component. In the case where no substantial ripple component is contained in the power source voltage, even if the photo-coupler 31 is directly connected between the collector and emitter of the transistor as shown in FIG. 2, it is impossible to take out an alternating current. Accordingly, an oscillator 34 is connected between the collector and emitter of the transistor 21 in parallel to the transistor 21 to effect oscillation according to the ON-OFF state of the transistor 21, and this oscillation output is taken out by the photo-coupler 31. Other structural features are the same as in the embodiment shown in FIG. 2.

FIG. 4a shows the output of the amplifier 32 for the ripple component being supplied to the monitor signal generating circuit 5 as indicated as a dotted line in FIG. 2.

Figure 5:
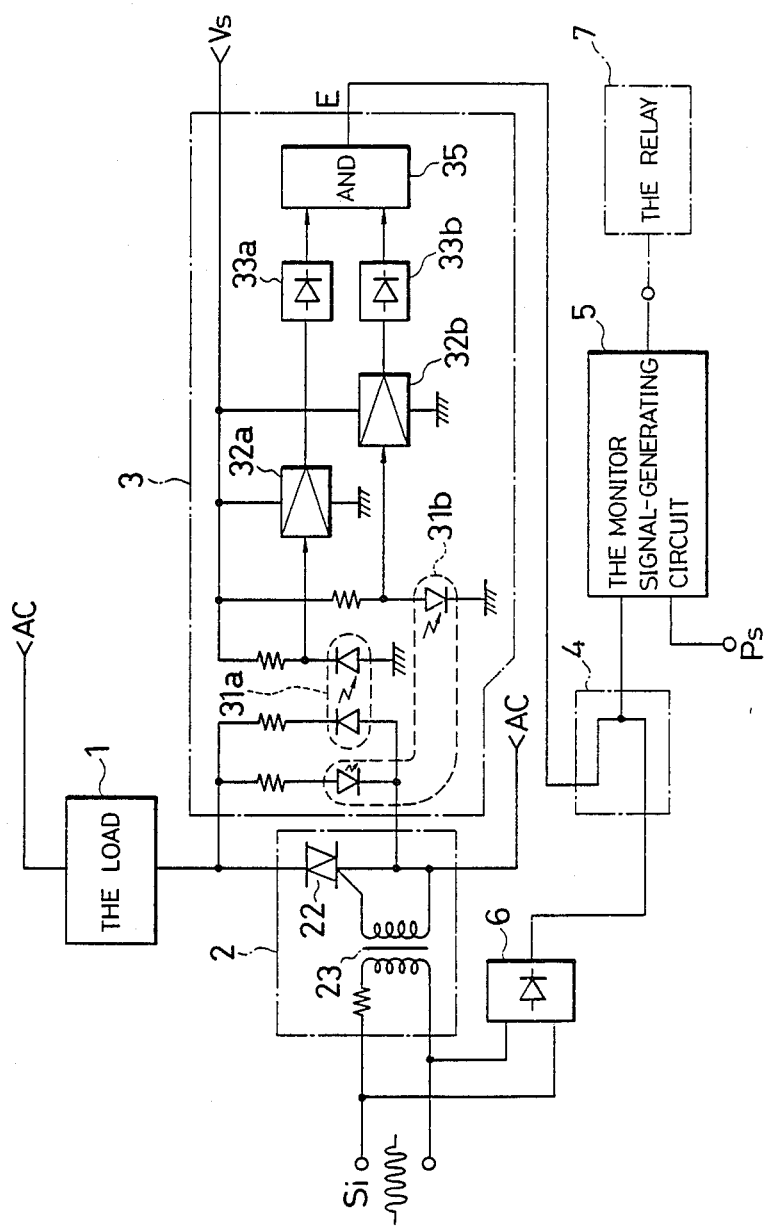
FIG. 5 is a circuit diagram illustrating a third embodiment of the present invention.

FIG. 5 illustrates the third embodiment of the present invention in which the load is driven by an alternating current power source. The alternating current power source AC is turned on and off by turning on and off a gate of the bidirectional thyristor 22 by the input signal Si through a transformer 23. For detection of the ON-OFF state of the thyristor 22, two photo-couplers 31a and 31b are connected to both the terminals of the thyristor 22 in parallel thereto to effect bidirectional detection. An alternating current signal received by a light-receiving element of the photo-coupler 31a is converted to a direct current signal by an alternating current amplifier 32a and a rectifier 33a and an alternating current signal received by a light-receiving element of the photo-coupler 31b is converted to a direct current signal by an alternating current amplifier 32b and a rectifier 33b. The two outputs from the rectifiers 33a and 33b are transmitted to an AND circuit 35 and an AND output of this AND circuit 35 is supplied to the logical addition circuit 4 as the output E of the switching detecting circuit 3. The reason why the logical product is computed in the AND circuit is that the conduction state and non-conduction state of the thyristor 22 is bidirectionally monitored. A fail-safe structure is necessary also for this AND circuit 35, and this can be realized by using a window comparator shown in FIG. 3. More specifically, the feedback loop F is cut and two inputs as AND gates are put in two input terminals Pi and Ps, respectively. Other structural features are the same as in the embodiment shown in FIG. 2.

I claim:

1. A monitoring system for load-driving switch circuits comprising a driving circuit means for driving an electrical load, a switch circuit means for rendering said driving circuit means conductive or non-conductive on receipt of an input signal, fail-safe switching detecting means for detecting a conductive or non-conductive state of said switch circuit means and used in generating a low voltage output when said switch circuit means is in the conductive state and a high voltage output when said switch circuit means is in the non-conductive state, and fail-safe logic function means having as inputs the output of said switching detecting means and said input signal, said fail safe logic function means performing a logic function on the output of said switching detecting means and said input signal, wherein said switch circuit means comprises a semiconductor switching element and the input signal of said switching element being a rectified or unrectified alternating current signal, said switching detecting means comprising oscillating means connected between output terminals of said switching element in parallel to aid switching element, coupling means for receiving an oscillating output of said oscillating means and providing an alternating current output, and means for rectifying said alternating current output of said coupling means and putting out the resulting rectified output.

2. A monitoring system for load-driving switch circuits according to claim 1, wherein said switching detecting means comprises coupling means connected between output terminals of said switching element in parallel thereto and means for rectifying an alternating current output of said coupling means and putting out the resulting rectified output.

3. A monitoring system for load-driving switch circuits according to claim 1, wherein said logic function means comprises a wired OR circuit.

4. A monitoring system for load-driving switch circuits according to claim 1, wherein said driving circuit means comprises an alternating current driving circuit and said switch circuit means comprises a bidirectional thyristor disposed in said alternating current driving circuit and a transformer for turning on and off a gate terminal of said thyristor by the alternating current input signal.

5. A monitoring system for load-driving switch circuits comprising a driving circuit means for driving an electrical load, a switch circuit means for rendering said driving circuit means conductive or non-conductive on receipt of an input signal, fail-safe switching detecting means for detecting a conductive or non-conductive state of said switch circuit means and used in generating a low voltage output when said switch circuit means is in the conductive state and a high voltage output when said switch circuit means is in the non-conductive state, and fail-safe logic function means having as inputs the output of said switching detecting means and said input signal, said fail safe logic function means performing a logic function on the output of said switching detecting means and said input signal, wherein said switch circuit means comprises a semiconductor switching element and the input signal of said switching element being a rectified or unrectified alternating current signal, said driving circuit means comprising an alternating current driving circuit and said switch circuit means comprises a bidirectional thyristor dispsoed in said alternating current driving circuit and a transformer for turning on and off a gate terminal of said thyristor by the alternating current input signal, said switching detection means comprising two photo-coupling means connected in parallel to said bidirectional tyristor, two rectifying means for rectifying alternating current signals obtained by said two photo-coupling means, respectively, and an AND circuit having two outputs from said two rectifying means as inputs to the and circuit.

6. A monitoring system for load-driving switch circuits, comprising:

driving circuit means for driving an electrical load;
first rectifying means for rectifying an input signal having an alternating current component and outputting a resulting rectified current;

switch circuit means for rendering said driving circuit means conductive or non-conductive in response to the rectified current received from said first rectifying means;

fail-safe switching detecting means for detecting a conductive or non-conductive state of said switch circuit means and for generating an alternating current when said switch circuit means is in the non-conductive state thereof, said switching detection means comprising second rectifying means for rectifying the alternating-current generated by said switching detecting means for providing a first output voltage level when an alternating current is provided by said fail safe switching detecting means and for providing a second output voltage level when no alternating current is supplied by said fail-safe switching detecting means, and fail-safe logic function means for performing a logic function on outputs of said first and second rectifying means supplied thereto as first and second inputs thereof, and for providing an output indicative of the logic function;

wherein a predetermined output voltage level of said logic function means is effective for indicating a dangerous condition of said load-driving switch circuits.

7. A monitoring system for load-driving switch circuits as recited in claim 6 wherein said switch circuit means comprises a semiconductor switching element.

8. A monitoring system for load-driving switch circuits as recited in claim 7 wherein said switching detecting means comprises means for detecting a voltage between output terminals of said semiconductor switching element.

9. A monitoring system for load-driving switch circuits as recited in claim 7, wherein said driving circuit means is arranged in a circuit for driving a direct current, said switching detecting means comprises oscillator means connected between output terminals of said semiconductor switching element in parallel thereto for generating an oscillating output when said switch circuit means is in the non-conductive state thereof, and photo coupling means for receiving said oscillating output of said oscillator means and for providing a varying output, and wherein said second rectifying means rectifies said varying output of said photo-coupling means.

10. A monitoring system for load-driving switch circuits as recited in claim 7 wherein:
said driving circuit means is arranged in a circuit for driving a direct current including a ripple voltage;
said switching detecting means comprises photo-coupling means connected between output terminals of said semiconductor switching element in parallel thereto for providing an output signal including varying components varying with the ripple voltage of the driving direct current; and
said second rectifying means including ac amplifier means for amplifying said varying components of said photo-coupling means output signal and a rectifier for rectifying an output of said ac amplifier means representing a varying output of said photo-coupling means.

11. A monitoring system for load-driving switch circuits as recited in claim 10, further comprising:
preset signal generating means for generating a preset signal, and fail-safe monitor signal generating means for generating a first voltage output level when the preset signal from said preset signal generating means and an output signal from said fail-safe logic function means are simultaneously present on inputs thereto.

said monitor signal generating means operable for latching said first voltage output level therefrom when said first output voltage level is fed back toward an input terminal for said preset signal and is placed in a first voltage output state, said monitor signal generating means further operable for detecting reduction of the output of said logic function means when the output thereof is reduced to a low voltage after said latching by said monitor signal generating means, and for releasing said latched first voltage output state to generate an output at a second voltage output level.

12. A monitoring system for load-driving switch circuits as recited in claim 11, wherein said monitor signal generating means comprises oscillator means having a computing function, said oscillator means operable for oscillating when outputs of said logic function means and said preset signal generating means are both input thereto at a predetermined voltage level.

13. A monitoring system for load-driving switch circuits as recited in claim 6, wherein said logic function means comprises a wired OR circuit.

14. A monitoring system for load-driving switch circuits as recited in claim 6,
wherein said switching detecting means comprises oscillator means for generating an oscillating output when said switch circuit means is in the non-conductive state thereof, and photo coupling means for receiving said oscillating output of said oscillator means and for providing a varying output, and
wherein said second rectifying means rectifies said oscillating output of said oscillator means and outputs the resulting rectified output,
and further comprising:
fail-safe monitor signal generating means connected to receive the varying output of said photo-coupling means as a preset signal and connected in a feedback arrangement for receiving an output thereof as a preset signal therefor, for generating a first voltage output level when the preset signal and an output signal from said fail-safe logic function means are simultaneously presented on inputs thereto.

15. A monitoring system for load-driving switch circuits, comprising:
driving circuit means for driving an electrical load with the alternating current;
switch circuit means for rendering said driving circuit means conductive or non-conductive in response to an input signal having an alternating current component,
first rectifying means for rectifying said input signal and outputting a resulting rectified current;
fail-safe switching detecting means for detecting a conductive or non-conductive state of said switch circuit means and for generating an alternating current when said switch circuit means is in the non-conductive state thereof, said switching detection means comprising second rectifying means for rectifying the alternating-current generated by said switching detecting means for providing a first output voltage level when an alternating current is provided by said fail safe switching detecting means and for providing a second output voltage level when no alternating current is supplied by said fail-safe switching detecting means, and fail-safe-logic function means for performing a logic function on outputs of said first and second rectifying means supplied thereto as first and second inputs thereof, and for providing an output indicative of the logic function;

wherein a predetermined output voltage level of said logic function means is effective for indicating a dangerous condition of said load-driving switch circuits.

16. A monitoring system for load-driving switch circuits as recited in claim 15, wherein said switch circuit means comprises bidirectional thyristor means disposed in said driving circuit means and transformer means for transferring said alternating current component of said input signal to said thyristor means for turning on and off a gate terminal thereof.

17. A monitoring system for load-driving switch circuits as recited in claim 16, wherein said switching detecting means comprises two photo-coupling means connected in parallel with said bidirectional thyristor means, said second rectifying means comprises third and fourth rectifying means for rectifying alternating current signals provided by said two photo-coupling means, respectively, and AND gating means having inputs respectively connected to outputs of said third and fourth rectifying means.

18. A monitoring system for load-driving switch circuits as recited in claim 17 wherein said AND gating means comprises a first oscillator means having a computing function, said first oscillator means operable for generating an oscillating output when said inputs from said third and fourth rectifying means are applied thereto substantially simultaneously, and fifth rectifying means for rectifying the oscillating output from said first oscillating means and for outputting a resulting rectified output.

19. A monitoring system for load-driving switch circuits as recited in claim 15 further comprising:

preset signal generating means for generating a preset signal, and fail-safe monitor signal generating means for generating a first voltage output level when the preset signal from said preset signal generating means and an output signal from said fail-safe logic function means are simultaneously present on inputs thereto.

said monitor signal generating means operable for latching said first voltage output level therefrom when said first output voltage level is fed back toward an input terminal for said preset signal and is placed in a first voltage output state, said monitor signal generating means further operable for detecting reduction of the output of said logic function means when the output thereof is reduced to a low voltage after said latching by said monitor signal generating means, and for releasing said latched first voltage output state to generate an output at a second voltage output level.

20. A monitoring system for load-driving switch circuits as recited in claim 19, wherein said monitor signal generating means comprises second oscillator means having a computing function, said second oscillator means having outputs from said logic function means and said preset signal generating means as inputs thereto, said second oscillator means operable for generating an oscillating output when said inputs from said logic function means and said preset signal generating means are both provided at a predetermined voltage level substantially simultaneously.

* * * * *